(12) United States Patent
Van De Beek et al.

(10) Patent No.: US 8,532,224 B2
(45) Date of Patent: Sep. 10, 2013

(54) SIGNAL PROCESSING CIRCUIT AND METHOD WITH FREQUENCY UP- AND DOWN-CONVERSION

(75) Inventors: Remco Van De Beek, Eindhoven (NL); Domine Leenaerts, Riethoven (NL); Charles Razzell, Pleasanton, CA (US); Jozef R. M. Ervoet, Eindhoven (NL)

(73) Assignee: St-Ericsson SA, Plan-les-Ouates (CH)

( * ) Notice: Subject to any disclaimer, the term of this patent is extended or adjusted under 35 U.S.C. 154(b) by 302 days.

(21) Appl. No.: 12/735,201

(22) PCT Filed: Dec. 19, 2008

(86) PCT No.: PCT/EP2008/068079
§ 371 (c)(1),
(2), (4) Date: Oct. 8, 2010

(87) PCT Pub. No.: WO2009/080776
PCT Pub. Date: Jul. 2, 2009

(65) Prior Publication Data
US 2011/0019773 A1    Jan. 27, 2011

(30) Foreign Application Priority Data

Dec. 21, 2007  (EP) .................................. 07123938

(51) Int. Cl.
*H03C 3/00*  (2006.01)

(52) U.S. Cl.
USPC ........... 375/302; 375/296; 375/307; 375/324; 375/322

(58) Field of Classification Search
USPC .......................... 375/302, 296, 307, 324, 322
See application file for complete search history.

(56) References Cited

U.S. PATENT DOCUMENTS

2004/0087279 A1* 5/2004 Muschallik et al. ............ 455/73
2006/0034356 A1   2/2006 Fechtel
2006/0109893 A1   5/2006 Chen et al.

OTHER PUBLICATIONS

International Search Report dated Mar. 8, 2010 in connection with PCT Patent Application No. PCT/EP2008/068079.
Written Opinion of the International Searching Authority dated Mar. 8, 2010 in connection with PCT Patent Application No. PCT/EP2008/0680.
Chia-Hung Hsu, et al., "FPGA Prototype for WLAN OFDM Baseband with STPE of I/Q Mismatch Self Calibration Algorithm", 2005 IEEE, p. 509-512.

* cited by examiner

*Primary Examiner* — Kabir A Timory
(74) *Attorney, Agent, or Firm* — Coats & Bennett, P.L.L.C.

(57) ABSTRACT

A signal processing circuit comprises a frequency up-conversion circuit (14, 60) for performing up-conversion with a first local oscillator frequency and a frequency down-conversion circuit (16) for performing down-conversion with a second local oscillator frequency. A digital signal processor (10) controls supply first signals representing a first complex signal to the up-conversion circuit, and receives second signals representing a second complex signal. The digital signal processor controls a compensation of I/Q mismatch of results of up-conversion and/or down-conversion. The digital signal processor (10) switches to a calibration mode for selecting a parameter of said compensation. In the calibration mode the first and second local oscillator frequencies have a frequency offset with respect to each other. The digital signal processor (10) measures an amplitude of a frequency component at a frequency corresponding to mismatch in one and not more than one of the results of up-conversion and/or down-conversion, and selects the parameter dependent on the amplitude.

13 Claims, 4 Drawing Sheets

SIGNAL PROCESSING CIRCUIT AND METHOD WITH FREQUENCY UP- AND DOWN-CONVERSION

CROSS-REFERENCE TO RELATED APPLICATION(S)

The present application claims priority under 35 U.S.C. §365 to International Patent Application No. PCT/EP2008/068079 filed Dec. 19, 2008, entitled "SIGNAL PROCESSING CIRCUIT AND METHOD WITH FREQUENCY UP- AND DOWN-CONVETER". International Patent Application No. PCT/EP2008/068079 claims priority under 35 U.S.C. §365 and/or 35 U.S.C. §119(a) to European Patent Application No. 07123938.8 filed Dec. 21, 2007 and which are incorporated herein by reference into the present disclosure as if fully set forth herein.

FIELD OF THE INVENTION

The invention relates to an electronic receiving and/or transmission device and to a method of operating such a device.

BACKGROUND OF THE INVENTION

In a quadrature receiving device a signal is mixed down with versions of a local oscillator signal that are ninety degrees out of phase with each other. This results in an in-phase signal and a quadrature signal that represent the real and imaginary parts of a complex signal. The spectrum of the resulting complex signal corresponds to the spectrum of the original signal, frequency shifted by the local oscillator frequency. Unlike mixing with a single signal, this makes it possible to distinguish frequency components at frequencies above and below the local oscillator frequency.

One problem with this type of receiver is that it is vulnerable to what is called I/Q mismatch, which occurs when the two mixing operations are not carefully matched. Such I/Q mismatch results in spurious signal components, i.e. components in the mixed down signal that seemingly indicate components of the original signal that are not actually present in the original signal. Similar problems arise for transmission, when two low frequency signals are mixed up to form a high frequency signal. In this case, the high frequency signal may contain a spurious component due to I/Q mismatch.

Self calibration to eliminate I/Q mismatch is known from an article by Chia-Hu Tsu, titled "FPGA prototype for WLAN OFDM baseband with FTPE of I/Q mismatch self-calibration algorithm". This article proposes to supply I/Q components of a single tone test signal low frequency signal in the baseband of a transmitter to mix these signals up to a high frequency signal. The power of the high-frequency signal is measured. This power varies at twice the frequency of the low frequency signal. The article proposes to use the phase of these variations to determine calibration parameters to eliminate I/Q mismatch. In addition to the single tone test signal, the article uses spectra of operational OFDM modulation signals to fine tune calibration.

This type of self tuning is quite complex.

SUMMARY OF THE INVENTION

Among others, it is an object to provide for an electronic receiving and/or transmission device that is configured to eliminate or reduce I/Q mismatch.

A signal processing circuit is provided. Herein a digital signal processor is configured to switch to a calibration mode for selecting a parameter for compensation of I/Q mismatch. First and second local oscillator frequencies are used for frequency up conversion and down conversion respectively in the calibration mode. The first and second local oscillator frequencies shaving a frequency offset with respect to each other.

The amplitude is measured of a frequency component of the result of up conversion and down conversion at a frequency corresponding to mismatch in one and not more than one of the results of up-conversion and/or down-conversion. The parameter is dependent on the amplitude.

In the case of compensation of I/Q mismatch during up-conversion the frequency at a frequency equal to the frequency offset minus a first frequency of a component in the original signal during calibration. In the case of compensation of I/Q mismatch during up-conversion the frequency at a frequency equal to minus a sum of the frequency offset and the first frequency of a component in the original signal during calibration. In a transceiver circuit parameters for compensating I/Q mismatch of both up-conversion and down-conversion may be determined in this way. In a receiver circuit only a parameter or parameters for compensating I/Q mismatch in down-conversion may be determined in this way. In a transmitter only a parameter or parameters for compensating I/Q mismatch in up-conversion may be determined in this way.

In an embodiment the combination of the first frequency and the frequency offset is selected so that the component falls within an anti-aliasing bandwidth used in an A/D conversion circuit for the down-converted signal. Thus, no adjustments to the A/D conversion circuit are need for operation in the calibration mode. For example the frequency offset may be selected at the edge of the bandwidth and the first frequency within the bandwidth. In an embodiment for a transceiver circuit different combinations may be used to determine parameters for compensating I/Q mismatch of up-conversion and down-conversion.

In an embodiment multiple up-conversion circuits are used, a first one for normal transmission operation and another for determination of a parameter for compensation. In this way predetermined changes in local oscillator frequency may be avoided.

BRIEF DESCRIPTION OF THE DRAWING

These and other objects and advantageous aspects will become apparent from a description of exemplary embodiments.

DETAILED DESCRIPTION OF EXEMPLARY EMBODIMENTS

Figure 1:
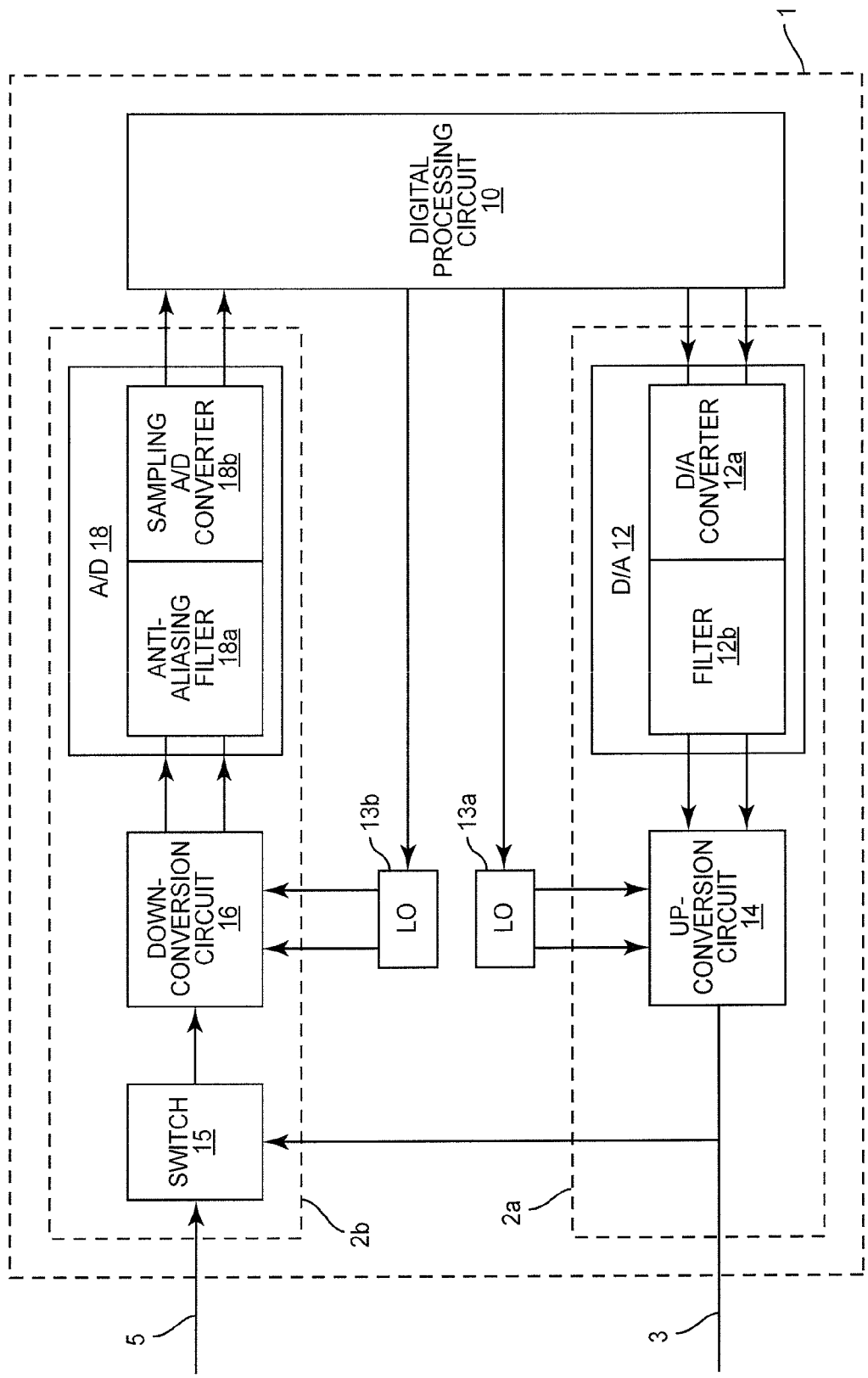
FIG. 1 shows a transceiver circuit

FIG. 1 shows a transceiver circuit 1 with a transmission branch 2a and a reception branch 2b. Transceiver circuit 1 comprises a digital processing circuit 10, a D/A conversion circuit 12, a first and second local oscillator circuit 13a,b, an up-conversion circuit 14, a switch 15, a down-conversion circuit 16 and an A/D conversion circuit 18.

Digital processing circuit 10 has an output coupled to D/A conversion circuit 12. D/A conversion circuit 12 has an output coupled to up-conversion circuit 14. Up-conversion circuit 14 has an output coupled to an output 3 of transceiver circuit 1. Switch 15 has signal inputs coupled to an input 5 of transceiver circuit 1 and to an output of up-conversion circuit 14. Switch 15 has an output coupled to an input of down-conversion circuit 16, an output of which is coupled to an input of A/D conversion circuit 18. A/D conversion circuit 18 has an output coupled to digital processing circuit 10. Switch 15 has a control input (not shown) coupled to digital processing circuit 10. Local oscillator circuits 13a,b have outputs coupled to up-conversion circuit 14 and down-conversion circuit 16 respectively.

Down-conversion circuit 16 may comprise multipliers (mixers) that multiply a down conversion input signal with in-phase and quadrature local oscillator signals that are ninety degrees out of phase with one another (as an alternative mixing may be performed with one local oscillator signal and versions of the down conversion input signal that are ninety degrees phase shifted relative to each other, or with combinations of local oscillator and signal phase shifts). Similarly up-conversion circuit 14 may comprise multipliers (mixers) that multiply I and Q up conversion input signals with in-phase and quadrature local oscillator signals respectively and a summing circuit to sum the results. Local oscillator circuits 13a,b have control inputs coupled to digital processing circuit 10. Optionally a driver circuit (not shown) may be included between up-conversion circuit 14 and output 3. Also optionally a low noise amplifier (not shown) may be included between input 5 and switch 15.

In a transmission mode, digital processing circuit 10 supplies sample values of in-phase and quadrature phase component signals I1, Q1 to D/A conversion circuit 12 (representing e.g. real and imaginary parts of a notional complex signal). Digital processing circuit 10 may be configured to perform OFDM modulation (Orthogonal Frequency Division Multiplexing modulation) to produce the signals I1, Q1 for example. D/A conversion circuit 12 comprises a D/A converter 12a followed by a filter 12b to suppress alias frequencies. As a result the output signal from the D/A conversion circuit corresponds to a low frequency signal represented by the samples I1, Q1. First up-conversion circuit performs an up-conversion of these component signals I1, Q1 to form an RF signal, that is, it shifts the frequencies of the signal represented by I1, Q1 by the local oscillator signal. The result is output to output 3.

In a reception mode, down-conversion circuit 16 down-converts an RF signal into component signals I2, Q2, that is, it shifts the frequencies of the down-conversion input signal by the local oscillator frequency. The results are digitized by A/D conversion circuit 18. A/D conversion circuit 18 comprises an anti aliasing filter 18a followed by a sampling A/D converter 18b, so that A/D conversion circuit 18 outputs samples representing a low frequency component of the component signals I2, Q2. Digital processing circuit 10 receives the digitized component signals I2, Q2 and processes them. Digital processing circuit 10 may be configured to perform OFDM demodulation for example. Typically, transmission branch 2a is deactivated in the reception mode and reception branch 2b is deactivated in the transmission mode.

I/Q mismatch may be present in the transceiver circuit 1. As used herein, I/Q mismatch (also "in-phase signal/quadrature signal mismatch") is any effect that has the result that the output of up-conversion circuit 14 and/or A/D conversion circuit 18 contains components at a plurality of frequencies in response to a component at a single frequency.

Examples of I/Q mismatch effects include errors in the quadrature relationship of local oscillator signals, cross talk in mixers that perform up-conversion and/or down-conversion, cross-talk in the A/D or D/A conversion circuits, gain differences between A/D or D/A conversion of I and Q components, gain differences in mixing and combinations thereof. A signal may consist exclusively of a single component or the signal may be a combination of such single frequency components. In the latter case, I/Q mismatch may have the result that each component results in components at a plurality of frequencies.

Figure 2A:
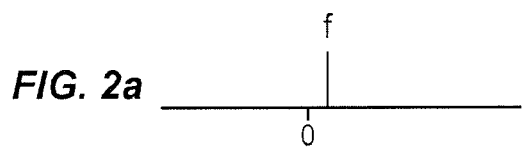
FIG. 2a-d show frequency components
Figure 2C:
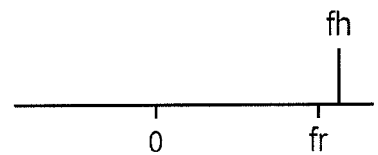
Figure 2B:
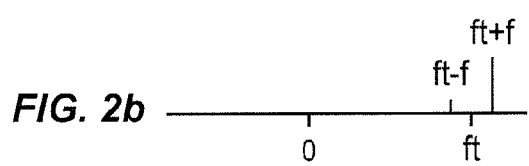

FIGS. 2a-d illustrate effects of I/Q mismatch. FIG. 2a shows a first trace representing a frequency component at a frequency f in a signal supplied by digital processing circuit 10 to a D/A conversion circuit 12. Such a frequency is represented when the in phase and quadrature phase component signals I1, Q1 correspond to the real and imaginary parts of A exp(j*2*PI*f*t) at positive frequency (herein f is the frequency, t is time and A is an amplitude). FIG. 2b shows the frequency components of the output of up-conversion circuit 14 in response to the signal component of FIG. 2a in the case of I/Q mismatch. Furthermore, the frequency ft of first local oscillator circuit 13a in the transmission mode is shown. As can be seen, two signal components occur, at frequency ft+f and ft−f. Without I/Q mismatch up-conversion only has the effect of shifting the frequency f by the local oscillator frequency ft, so that only one component would occur, at frequency ft+f. The component at ft−f is a spurious signal.

Figure 2D:
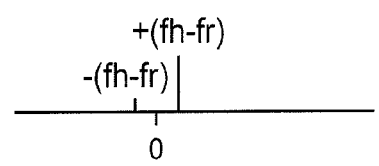

FIG. 2c shows a trace representing a frequency component at a frequency fh in a signal from input 5 of the transceiver circuit. Furthermore, the frequency fr of second local oscillator circuit 13b in the reception mode is shown. In an embodiment this frequency fr is the same as the frequency ft when transmission and reception in the same band is used. FIG. 2d shows the frequency components represented by the signals I2, Q2 at the output of A/D conversion circuit 18 in response to the signal component of FIG. 2c in the case of I/Q mismatch. As can be seen, two signal components occur, at frequency +(fh−fr) and −(fh−fr).

Without I/Q mismatch, only one component would occur, at frequency +(fh−fr). Hence the component at −(fh−fr) is a spurious signal.

Digital processing circuit 10 is configured to compensate for I/Q mismatch.

Several compensation methods are possible, including digitally transforming the I and Q signals to apply the inverse of the I/Q mismatch, adjusting a cross-coupling and/or gain in the D/A and/or A/D conversion circuits or adjusting the phase and amplitude relationship of the local oscillator signals. In the case of compensation by digital transformation, digital processing circuit 10 may derive the input signal I1, Q1 of D/A conversion circuit 12 from original signals I0, Q0 from a transformation I1=c11*I0+c12*Q0, and Q1=c21*I0+c22*Q0, wherein part or all of the coefficients c11, c12, c21, c22 may be selected dependent on I/Q mismatch. Herein part or all of the coefficients c11, c12, c21, c22 may be frequency dependent, in which case the multiplications may be replaced by filter operations.

In one embodiment, it is assumed that the components that result from I/Q mismatch are linearly proportional to the component by which they are caused. Thus for example it is assumed that the amplitudes B1, B2 of the components at frequencies ft+f and ft−f in FIG. 2b are proportional to the amplitude A of the signal from digital signal processing circuit 10: B1=b1*A and B2=b2*A. Using the proportionality constants b1, b2, digital signal processing circuit 10 derives coefficients c11, c12, c21, c22 that transform its original output signal by imposing the inverse effect of I/Q mismatch, so that after up-conversion the result of up-converting the original signal without I/Q mismatch results.

Frequency dependent proportionality constants b1, b2 may be used, in which case the inverse transformation involves applying linear filter operations. In the reception digital processing circuit 10 applies a similar inverse transformation to the output of A/D conversion circuit 18.

For compensation digital processing circuit 10 needs information about the constants of proportionality b1, b2 for the transmission mode and/or the constants of proportionality for the reception mode. Digital processing circuit 10 is configured to switch to reception and transmission calibration modes to obtain this information.

In the calibration modes digital processing circuit 10 controls first local oscillator 13a to set its output frequency f1 to the output frequency f2 of second local oscillator 13b plus a frequency shift Df. Furthermore, in the calibration modes digital processing circuit 10 controls switch 15 to supply a signal from up-conversion circuit 14 to down-conversion circuit 16. Also in the calibration modes digital processing circuit 10 supplies signals I1, Q1 representing a single frequency complex signal A exp(j*2*PI*f*t) at positive frequency (herein f is the frequency, t is time and A is an amplitude).

Figure 3A:
FIG. 3a-c show frequency components
Figure 3B:
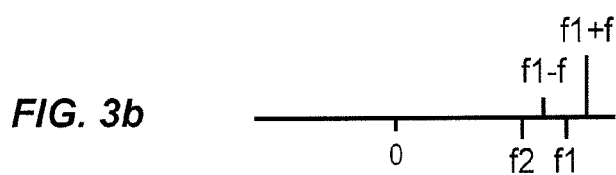
Figure 3C:
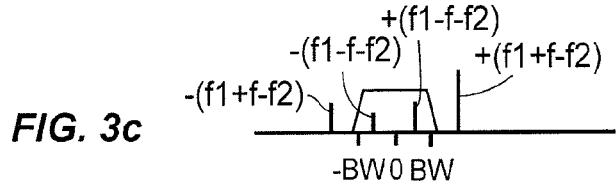

FIGS. 3a-c illustrate the frequencies involved in the transmission calibration mode. The frequency f and the frequency shift Df between the frequencies f1 and f2 of the first and second local oscillator circuit 13a,b are selected so that their sum f+Df is greater than the bandwidth BW of the anti-aliasing filter 18a in A/D conversion circuit 18 and their difference Df−f is less than said bandwidth. In an embodiment this may be realized by making the difference Df equal to the bandwidth BW of anti-aliasing filter 18a and the frequency f less than this bandwidth BW.

Under circumstances without I/Q mismatch no in-band signals will be output by A/D conversion circuit 18 in the calibration mode, because the only signal component output by up-conversion circuit 14 is at a frequency f+Df outside the bandwidth received by the combination of down-conversion circuit 16 and A/D conversion circuit 18.

FIGS. 3b and 3c illustrates spurious signals in the calibration mode due to I/Q mismatch. In FIG. 3b the frequency components in the output signal of up-conversion circuit 14 are shown. These include a components at frequencies f1+f and f1−f, the former being a normal effect of the frequency shift by the local oscillator frequency and the latter being a spurious effect of I/Q mismatch.

FIG. 3c shows the frequency components in the output of A/D conversion circuit 18. Each of the components of the output signal of up-conversion circuit 14 results in two components at the output of A/D conversion circuit 18, one as a normal effect and one due to I/Q mismatch. Thus, I/Q mismatch may occur both in reception branch 2b and transmission branch 2a. As a result, components occur at frequencies +(f1+f−f2), −(f1+f−f2), +(f1−f−f2) and −(f1−f−f2). The component at frequency +(f1+f−f2) is the normal signal, representing the original signal shifted by frequencies f1 and f2. The component at frequency +(f1−f−f2) is the result of mismatch during up-conversion and normal shifting at down conversion. The component at frequency −(f1+f−f2) is the result of mismatch during down-conversion and normal shifting at up-conversion. The component at frequency −(f1−f−f2) is the result of mismatch during both up-conversion and down-conversion.

Due to the selection of the frequency offset Df=f1−f2 and the frequency f only components at frequencies +(f1+f−f2) =+(Df+f) and (f1−f−f2)=(Df−f) due to mismatch free operation and mismatch in transmission branch 2a results in in-band signals of A/D conversion circuit 18. Therefore, only these signals are passed. As may be noted the first component at frequency +(Df+f) is due to the effect of a single mismatch, during up-conversion. The other component is due to mismatch during both up-conversion and down conversion. Digital processing circuit 10 performs a frequency analysis computation, such as a Fourier transform on the output signal of A/D conversion circuit 18 and from the component amplitudes at frequencies (Df+f) and (Df−f) that result from this analysis it derives the constants of proportionality for compensating I/Q mismatch in transmission branch 2a.

In an embodiment wherein transceiver 1 is an OFDM transceiver, a Fourier analysis model for OFDM modulation may be used for this analysis. Thus no additional module is needed for this purpose. However, alternatively, a filter bank or any other analysis technique may be used to perform the analysis.

Figure 4A:
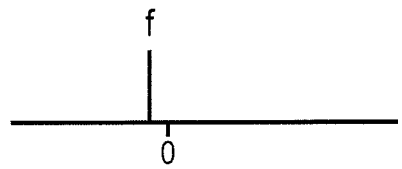
FIG. 4a-f show frequency components
Figure 4B:
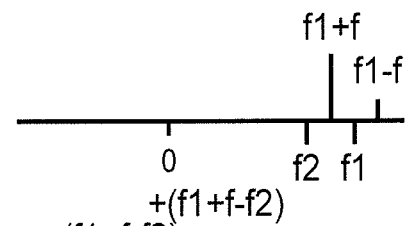
Figure 4C:
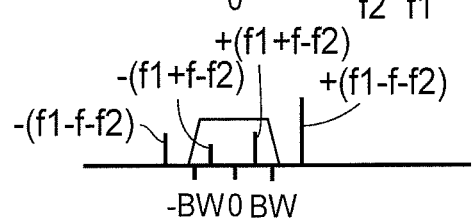
Figure 4D:
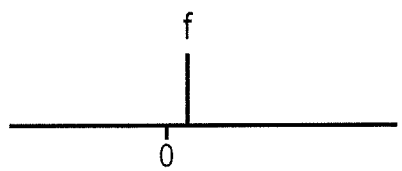

FIGS. 4a-c illustrate the frequencies involved in the reception calibration mode.

As may be noted the relative choice of the frequency offset Df and the frequency f is different from transmission calibration, the frequency f of the signal I1, Q1 being chosen smaller than zero. Df may be chosen equal to the bandwidth BW of A/D conversion circuit 18 and the size of f may be chosen less than this bandwidth BW, or more generally the sum −Df+f may be chosen greater than the bandwidth and the −Df−f may be chosen less than the bandwidth. As a result only components at frequencies +(f1+f−f2)=+(Df+f) and −(f1+f−f2)=− (Df+f) results in in-band signals of A/D conversion circuit 18.

The component at frequency +(f1+f−f2) is the normal component. The component at frequency −(f1+f−f2) is the result of normal shifting during up-conversion and mismatch during down-conversion. Digital processing circuit 10 performs a frequency analysis computation on the output signal of A/D conversion circuit 18 and from the component amplitudes at frequencies (Df+f) and −(Df+f) that result from this analysis it derives the constants of proportionality for compensating I/Q mismatch in reception branch 2b.

The transmission calibration and the reception calibration may be repeated for a plurality of different frequencies, f, in order to derive a frequency dependent compensation if necessary. Furthermore, compensation may be amplitude dependent. In this case the measurements of the effects of I/Q mismatch in the calibration modes may be performed for signal combinations I1, Q1 at a plurality of amplitudes.

Figure 4E:
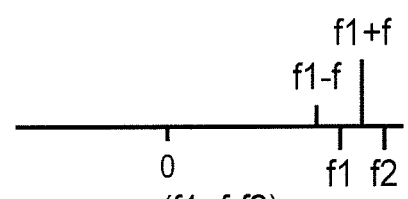
Figure 4F:
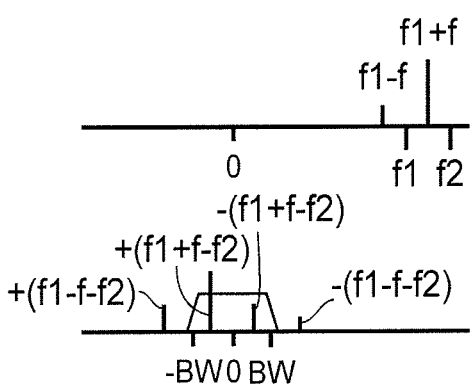

Various different combinations of frequencies may be used. For example the frequency f of the original signal 11, Q2 and the frequency offset Df may be made negative in the transmission calibration. Similarly, the frequency f of the original signal 11, Q2 may be made positive and the frequency offset Df may be made negative in the transmission calibration. Thus, the components due to a single mismatch still lie within the bandwidth BW. This is illustrated in FIGS. 4e-f. When the calibrations of FIGS. 3a-c and 4d-f are combined a switch of local oscillator frequency is needed between these modes. When digital signal processor 10 switches between a positive frequency f and a negative frequency f when switching between the transmission calibration mode and the reception calibration mode, no switching of the local oscillator frequency is needed.

It should be appreciated that many variations are possible on this compensation method. For example, a compensation for I/Q mismatch during transmission may be applied in the reception calibration mode and/or a compensation for I/Q mismatch during reception may be applied in the reception calibration mode in order to reduce the suppression of the other form of I/Q mismatch further during calibration.

As another example, instead of computing of the coefficients of the transformation from the analysis the output signal of A/D conversion circuit 18 to compensate for I/Q mismatch, an iterative process may be used, wherein successive compensations for I/Q mismatch are selected and the detected component amplitudes obtained with these compensations are determined until I/Q mismatch is minimized.

Also, instead of using a signal with a component at single frequency, f, during calibration, a signal with a plurality of simultaneous components may be used. In an embodiment the effects of different ones of these components may be resolved by frequency analysis and/or ambiguities introduced by combining components may be resolved by combining measurement with signals with different combinations of components.

Df may be made smaller or larger than the bandwidth. It is advantageous f and Df are selected so that the frequency components that have to be measured to determine the mismatch compensation are within the bandwidth BW of A/D conversion circuit 18.

Alternatively, other combinations may be used, wherein Df−f exceeds the bandwidth. In this case the bandwidth of anti-alias filter of A/D conversion circuit 18 needs to be changed during calibration, or it must be bypassed. Using frequencies so that Df−f is within the bandwidth has the advantage that the anti-alias filter of A/D conversion circuit 18 can be used when the parameters are estimated. need not be can be used to suppress the effect of other mismatch. However, even if these effects are in-band, frequency analysis by digital processing circuit 10 can be used to distinguish the different mismatch effects. Selecting the frequencies so that Df+f lies outside the bandwidth has the advantage that analysis of the components is easier during transmission calibration.

Up-conversion and down-conversion may involve a frequency shift of a complex signal corresponding to I+iQ by the local oscillator frequency. Alternatively a shift of a complex signal I−iQ may be used. As may be noted this has the effect of changing the sign of the frequencies of the frequency components, so that up or down conversion of I−iQ could be viewed as frequency inversion combined with a shift of frequency of I+iQ.

However, as the signals I, Q can be notionally considered to represent I−iQ the frequency conversion will still be termed a frequency shift. Instead of supplying I and Q signals, amplitude and phase signals may be supplied, which represent the same signal I+iQ or I−iQ. In this case a similar compensation for I/Q mismatch may be used.

Figure 5:
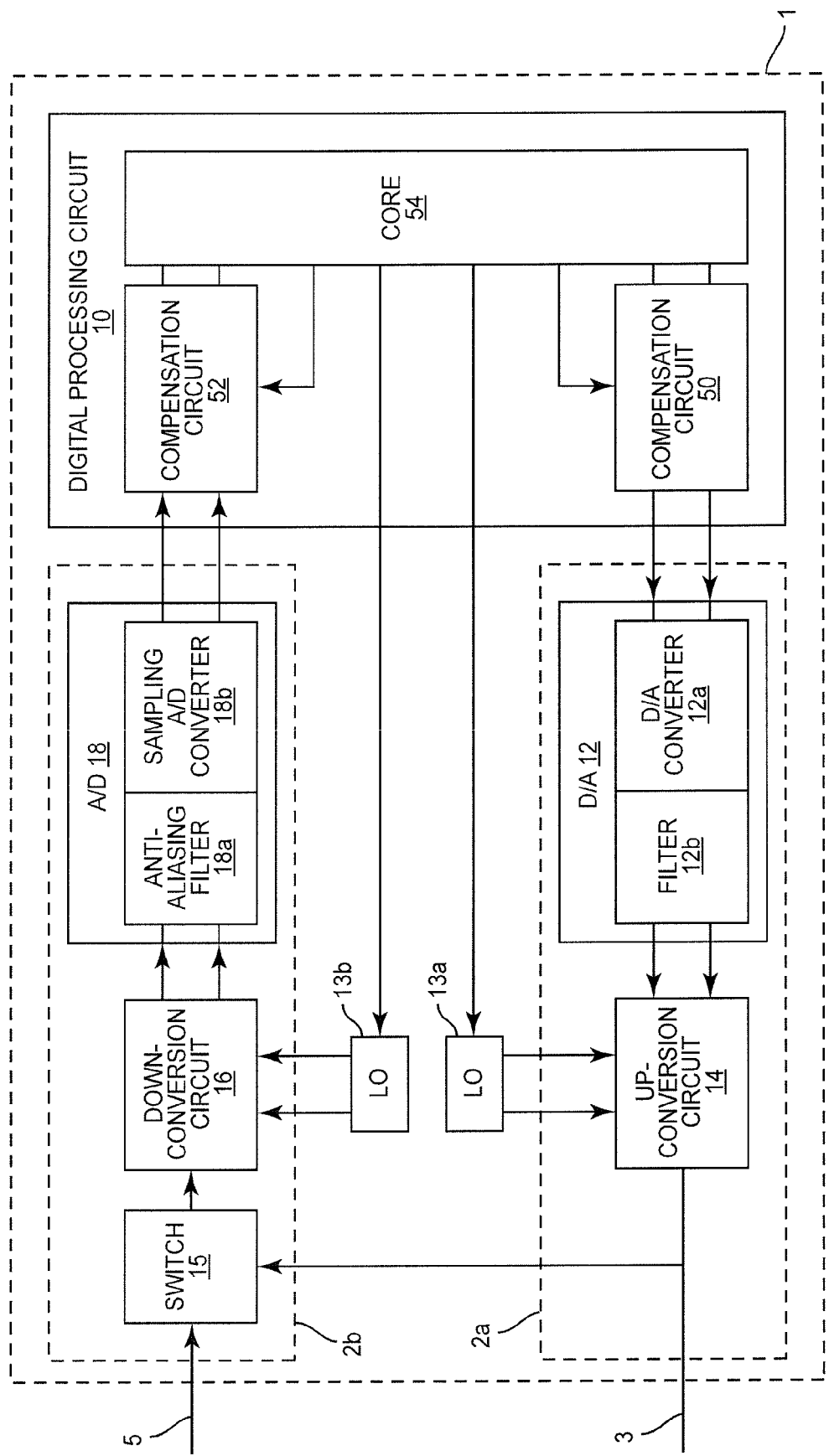
FIG. 5 shows transceiver circuits

FIG. 5 shows an embodiment wherein compensation circuits 50, 52 have been added between the core 54 of digital processing circuit 10 and the D/A conversion circuit 14 and the A/D conversion circuit 18. Compensation circuits 50, 52 may be considered to be part of digital processing circuit 10 or D/A conversion circuit 14 and the A/D conversion circuit 18. Compensation circuits 50, 52 may be realized by software running on a programmable processor in digital processing circuit 10. Alternatively, compensation circuits 50, 52 may be integrated in D/A conversion circuit 14 and the A/D conversion circuit 18.

Thus, for example the D/A conversion function may be adjusted under control of the calibration selected in the calibration mode.

Although an embodiment has been shown wherein a first and second local oscillator 13a,b are used, it should be realized that local oscillator signals with a frequency offset DF relative to one another may be realized in different ways, for example by mixing the signal of one local oscillator with a signal with a frequency equal to the frequency offset, dividing down one or more signals with higher frequencies etc. Also, frequency synthesizers may be used with PLLs (phase locked loops) configured to produce frequencies with a frequency offset.

Although an embodiment has been shown with an A/D conversion circuit with an A/D converter wherein the bandwidth is determined by an analog anti-aliasing filter before the A/D converter, it should be realized that the A/D conversion band width can be realized in other ways. For example, an over-sampling A/D converter may be used, followed by a digital filter that determines the bandwidth and optionally a decimator to reduce the sample rate after digital filtering.

Although an embodiment has been shown in a transceiver circuit, that is, a circuit with an output 3 and an input 5 for transmission and reception respectively, it should be appreciated that the same calibration techniques may also be applied to a reception only circuit, or a transmission only circuit. In this case a transmission branch or a reception branch will be added to the circuit for calibration only, although it need not be connected to an external output or input. In an embodiment the transceiver, receiver or transmitter configured (e.g. programmed or hardware structured) to perform the described calibration may be integrated in a single integrated circuit.

Although an embodiment has been shown with an up-conversion circuit 14 that has its output coupled both to output 3 and switch 15, it should be realized that alternatively a further up-conversion circuit (not shown) may be provided between D/A conversion circuit 12 and switch 15, optionally with its own local oscillator circuit.

In this case, a single local oscillator circuit 13a may be used to supply the same local oscillator signal to both up-conversion circuit 14 and down-conversion circuit 16, when a single band transceiver is realized. A further local oscillator (not shown) is set to provide a signal at a frequency offset Df above or below the frequency of this local oscillator signal. In a further embodiment digital signal processor 10 may be configured to switch between a positive frequency f and a negative frequency f when switching between the transmission calibration mode and the reception calibration mode. In this case, no switch of local oscillator frequency is needed.

As an alternative up-conversion circuit 14 may combined with a further local oscillator (not shown). In this case a further switching circuit (not shown) may be used to switch between supplying local oscillator signals from first local oscillator 13a and the further local oscillator to up-conversion circuit 14, an output of up-conversion circuit 14 being supplied to switching circuit 15.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A signal processing circuit comprising:
a frequency up-conversion circuit with an up-conversion input and an up-conversion output, for performing up-conversion with a first local oscillator frequency;
a frequency down-conversion circuit with a down conversion input coupled to the up-conversion output and a down-conversion output, for performing down-conversion with a second local oscillator frequency;
a digital signal processor, having a processor output, for controlling supply of first signals representing a first complex signal to the up-conversion input, and a processor input coupled to down-conversion output, for receiving second signals representing a second complex signal, the digital signal processor being configured to control a compensation of I/Q mismatch of results of up-conversion and/or down-conversion;
the digital signal processor being configured to switch to a calibration mode for selecting a parameter of said compensation, and wherein, in said calibration mode, the digital signal processor is further operative to:
control the first and second local oscillators to output frequencies having a frequency offset with respect to each other;
measure an amplitude of a frequency component at a frequency corresponding to mismatch in one and not more than one of the results of up-conversion and/or down-conversion, and to select the parameter dependent on the amplitude;
include a frequency component at a first frequency in the first complex signal; and
select the parameter for said compensation mismatch dependent on the amplitude of a component of the second digital signal at a frequency corresponding to the frequency offset of the oscillators, offset by the first frequency.

2. The signal processing circuit according to claim 1, wherein the parameter compensates mismatch in the results of up-conversion, and wherein the component of the second digital signal is at a frequency equal to the frequency offset of the oscillators minus the first frequency.

3. The signal processing circuit according to claim 2, comprising an A/D conversion circuit with an A/D conversion input coupled to the down-conversion output and an A/D conversion output coupled to the digital processing circuit for supplying said second signals, the A/D conversion circuit comprising an anti-aliasing filter that determines an A/D conversion bandwidth, the digital processing circuit being configured to set the frequency offset and the first frequency so that frequency offset minus the first frequency lies within the bandwidth.

4. The signal processing circuit according to claim 1, wherein the parameter compensates mismatch in the results of down-conversion, and wherein the component of the second digital signal is at a frequency equal to minus a sum of the frequency offset of the oscillators and the first frequency.

5. The signal processing circuit according to claim 4 comprising an A/D conversion circuit with an A/D conversion input coupled to the down-conversion output and an A/D conversion output coupled to the digital processing circuit for supplying said second signals, the A/D conversion circuit comprising an anti-aliasing filter that determines an A/D conversion bandwidth, the digital processing circuit being configured to set the frequency offset and the first frequency so that minus a sum of the frequency offset and the first frequency lies within the bandwidth.

6. The signal processing circuit according to claim 1 comprising a first local oscillator and a second local oscillator and a further frequency up-conversion circuit with a further up-conversion output coupled to an output terminal of the signal processing circuit, the first local oscillator being coupled to both the frequency down-conversion circuit and the further frequency up-conversion circuit, the second local oscillator circuit being coupled to the frequency up-conversion circuit.

7. The signal processing circuit according to claim 1, comprising an input terminal and a switching circuit that is controllable dependent on selection of the calibration mode, the up-conversion output and the input terminal being coupled to inputs of the switching circuit and output of the switching circuit being coupled to the down-conversion input.

8. The signal processing circuit according to claim 1 comprising a first local oscillator and a second local oscillator, the first local oscillator being coupled to the frequency up-conversion circuit, the second local oscillator circuit being coupled to the frequency down-conversion circuit, the digital processing circuit being configured to control the frequencies of the first local oscillator and/or the second local oscillator in the calibration mode, to set the frequency offset.

9. A method, performed on a signal processing circuit that performs frequency up-conversion of in-phase and quadrature signals (I,Q) and/or frequency down-conversion to produce I and Q signals by mixing with local oscillator signals, of compensating an effect of I/Q mismatch during frequency up-conversion and/or frequency down-conversion by determining a parameter used in said compensating, the method comprising:
up-converting first signals representing a first complex signal, to shift frequencies of the first complex signal by a first local oscillator frequency;
down-converting a result of said up-converting into second signals representing a second complex signal, wherein frequencies resulting from said up-converting are shifted by a second local oscillator frequency, the first local oscillator frequency having a frequency offset with respect to the second local oscillator frequency;
inserting a component at a first frequency in the first complex signal;
determining an amplitude of a frequency component in said second complex signal that is a result of I/Q mismatch in one and no more than one of said up-converting and said down-converting, the frequency component at a frequency corresponding to the frequency offset of the oscillators, offset by the first frequency; and
determining said parameter dependent on the amplitude.

10. The method according to claim 9, wherein the parameter is used for compensating an effect of I/Q mismatch during frequency up-conversion, and wherein the frequency for which the amplitude is determined is equal to the frequency offset minus the first frequency.

11. The method according to claim 9, comprising anti-alias filtering the second complex signal with a filter bandwidth, a combination of the frequency offset and the first frequency being selected so that the frequency offset minus the first frequency lies within the bandwidth.

12. The method according to claim 9, wherein the parameter is used for compensating an effect of I/Q mismatch during frequency down-conversion, and wherein the frequency for which the amplitude is determined is equal to minus a sum of the frequency offset and the first frequency.

13. The method according to claim 12, comprising anti-alias filtering the second complex signal with a filter bandwidth, a combination of the frequency offset and the first frequency being selected so that minus a sum of the frequency offset and the first frequency lies within the bandwidth.

* * * * *